(12) United States Patent
Kato et al.

(10) Patent No.: US 7,300,881 B2
(45) Date of Patent: Nov. 27, 2007

(54) PLASMA ETCHING METHOD

(75) Inventors: Kazuya Kato, Nirasaki (JP); Katsuhiko Ono, Nirasaki (JP); Hideki Mizuno, Nirasaki (JP); Masahiro Ogasawara, Nirasaki (JP); Akinori Kitamura, Nirasaki (JP); Noriyuki Kobayashi, Nirasaki (JP); Yasushi Inata, Nirasaki (JP); Shin Okamoto, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/935,103

(22) Filed: Sep. 8, 2004

(65) Prior Publication Data

US 2005/0101137 A1   May 12, 2005

(30) Foreign Application Priority Data

Sep. 8, 2003   (JP) ............................. 2003-315844
Aug. 18, 2004  (JP) ............................. 2004-238250

(51) Int. Cl.
*H01L 21/302*   (2006.01)
*H01L 21/3065*  (2006.01)

(52) U.S. Cl. ................ 438/706; 438/723; 438/724; 252/79.1

(58) Field of Classification Search ................ 438/706, 438/723, 724; 252/79.1
See application file for complete search history.

(56) References Cited

U.S. PATENT DOCUMENTS

| 6,942,816 B2 * | 9/2005 | Rusu et al. ................ 216/49 |
| 2003/0164354 A1 * | 9/2003 | Hsieh et al. ................ 216/22 |
| 2004/0155012 A1 * | 8/2004 | Rusu et al. ................ 216/67 |

* cited by examiner

*Primary Examiner*—Nadine Norton
*Assistant Examiner*—Lynette T. Umez-Eronini
(74) *Attorney, Agent, or Firm*—Oblon, Spivak, McClelland, Maier & Neustadt, P.C.

(57) ABSTRACT

A plasma etching is performed on a substrate having a pattern wherein an interval between neighboring openings formed on a resist mask is equal to or less than 200 nm, wherein the etching is performed by converting a processing gas comprising an active species generating gas which includes a compound having carbon and fluorine, and a nonreactive gas which includes xenon gas into a plasma. The nonreactive gas further includes argon gas.

9 Claims, 13 Drawing Sheets

FIG.4

| | COMPARATIVE EXAMPLE 1 | EXAMPLE 1-1 | EXAMPLE 1-2 | EXAMPLE 1-3 |
|---|---|---|---|---|
| PLAN VIEW OF HOLE | Ar = 1400 sccm<br>Xe = 0 | Ar = 1250 sccm<br>Xe = 150 sccm | Ar = 1150 sccm<br>Xe = 250 sccm | Ar = 1050 sccm<br>Xe = 350 sccm |
| (RESIST + SiO$_2$) CROSS SECTIONAL VIEW | | | | |
| SELECTIVITY | 2.4 | 4.0 | 4.1 | 3.7 |

COMPARATIVE
EXAMPLE 4

Ar = 600 sccm
Xe = 0

HOLE SHAPE

64

SELECTIVITY 1.7

EXAMPLE 4-1

Ar = 480 sccm
Xe = 120 sccm 1.9

EXAMPLE 4-2

Ar = 450 sccm
Xe = 150 sccm 2.9

EXAMPLE 4-3

Ar = 420 sccm
Xe = 180 sccm 1.9

COMPARATIVE EXAMPLE 6
Ar = 700sccm
Xe = 0

EXAMPLE 6
Ar = 350 sccm
Xe = 350 sccm

FIG.12A

CENTRAL PORTION OF WAFER

|  | DENSE PATTERN | SPARSE PATTERN |
|---|---|---|
| COMPARATIVE EXAMPLE 7-2 | 13.9 | 6.6 |
| EXAMPLE 7-2 | > 20 | > 20 |

FIG.12B

PERIPHERAL PORTION OF WAFER

|  | DENSE PATTERN | SPARSE PATTERN |
|---|---|---|
| COMPARATIVE EXAMPLE 7-2 | 15.0 | 9.2 |
| EXAMPLE 7-2 | 29.3 | 26.0 |

PLASMA ETCHING METHOD

FIELD OF THE INVENTION

The present invention relates to a plasma etching method for etching a surface of a substrate by using a gas composed of a compound containing carbon and fluorine.

BACKGROUND OF THE INVENTION

A manufacturing process of semiconductor devices may involve an etching process using a plasma, wherein the processing condition for the etching process, such as selection of the processing gas used, is determined based on the types of the film to be etched and the under film. For example, in order to etch a $SiO_2$ film (silicon oxide film) or a SiCOH film (hydrogenated silicon oxycarbide film), which contains silicon and oxygen to serve as an insulating film, there has been known a method for converting a gas containing C (carbon) and F (fluorine) into a plasma to thereby allow $SiO_2$ or SiCOH to be removed by a reaction with a CF based or a CHF based radical. For example, there has been known a method for performing an etching by using a $C_xF_y$ gas (fluorocarbon gas), CO gas (carbon monoxide gas), $O_2$ gas (oxygen gas) and a nonreactive gas in order to form a contact hole at a $SiO_2$ film (silicon oxide film) serving as an insulating film (see Japanese Patent Laid-open Application No. H6-338479, paragraphs 0026, 0039, 0050 and FIG. 1: Reference 1). Though $N_2$ gas serving as a dilution gas may be employed as the nonreactive gas, Ar gas is also widely employed because the Ar gas tends to be readily converted into a stable flow of plasma, and to facilitate dissociation of the CF based gas to thereby increase CF based active species.

Meanwhile, with a recent trend for high integration of semiconductor devices, various problems have occurred. For instance, patterns are becoming finer and a distance between neighboring holes or grooves, which are recesses to be etched, is getting narrower. Further, it is expected that the distance between, for example, holes for burying capacitance devices would be reduced to 200 nm or less in a future design rule. In case the holes are closely located to such extent, however, a new problem may occur.

Referring to FIGS. 13 to 15, the new problem will be described. In FIG. 13, reference numerals 11, 12 and 13 represent a $SiO_2$ film, a resist mask (resist film) and holes, respectively. In case of performing an etching on a substrate having such surface layers by using a processing gas including $C_4F_8$ gas and a nonreactive gas, the inner peripheral surfaces of the holes 13 may become undulated because resist portions between the holes 13 are very thin. As a result, a desired shape of the holes 13, e.g., a circular shape or an elliptical shape, cannot be obtained. FIG. 14 shows poor shapes of circular holes 13 formed at the resist mask, which are viewed from the top after the etching. If the holes 13 of the resist mask 12 are undulated as shown therein, their shapes are transferred to holes of the $SiO_2$ film 11, resulting in an occurrence of striation, i.e., a formation of grooves elongated in a depth direction at the inner peripheral surfaces of the corresponding holes. Given that the holes themselves are minute, various problems may be caused if the shapes of the holes become poor and irregular. For instance, a desired capacitance cannot be obtained in case the holes are for use in burying capacitance devices, and an expected conductivity cannot be obtained in case the holes are formed as contact holes, resulting in a reduction of yields in both cases.

Further, if it is difficult to avoid cutting of angled portions of the resist mask 12 by an etching gas, and if resist portions between the holes 13 are very thin, the angled portions 14 may be cut at both sides, as shown in FIG. 15, and interferences therebetween may cause poor shapes of holes 13 which may be transferred to the holes of the $SiO_2$ film, thereby reducing the yields. Moreover, there is also a likelihood that the selectivity, i.e., the ratio of an etching rate of the $SiO_2$ film to an etching rate of the resist mask 12 may be reduced. As patterns become finer, the wavelength of an exposure light source becomes shorter, so that it is required to further reduce the thickness of the resist mask. For this reason, it is undesirable to have the selectivity reduced. This problem also occurs for, e.g., a SiCOH film, which is receiving considerable attention as an interlayer insulating film with a low dielectric constant, as well as the $SiO_2$ film. In case of the SiCOH film, there may occur another problem that upper portions of recesses are enlarged in case patterns become finer. If such a problem occurs in case the recesses are, e.g., via holes (through holes) in which materials for a conductive channel for connecting an upper layer circuit and a lower layer circuit are to be buried, the irregular diameters of the holes may cause capacitances between the via holes when they are crowded, resulting in a delay in a signal transfer. The reason for this is still being investigated but it is conjectured that the Ar gas used in the plasma etching causes widening of the resist mask's openings which in turn causes this problem.

Moreover, below the SiCOH film, there is an under film (etching stop layer) also referred to as a stop layer for stopping the etching of the SiCOH film. For example, a silicon carbide film, a silicon nitride film, a SiON film or a SiCO film is used as the under film. In case of etching the SiCOH film, there occurs a problem that the selectivity of the SiCOH film against the under film tends to be low. Thus, a so-called overetching of the under film may be performed at a part of a wafer surface which is etched to reach a bottom of the SiCOH film first, and an etching of the under film is conducted because the selectivity is low, so that a lower layer wiring is etched through the under film. As a result, the in-surface uniformity in the thickness of the under film is reduced. In such event, resistances at connection portions for connecting the lower layer circuit and the upper layer circuit become different across the wafer surface, resulting in a decrease of yields. The above-mentioned problem is not considered in Reference 1.

Further, Reference 2 (i.e., Japanese Patent Laid-open Application No. H11-168090, paragraphs 0013, 0014, 0019 and 0020) discloses that, in case of etching a BPSG (boron phosphorous silicate glass) film after forming a pattern of holes with a diameter of 0.18 μm on a mask, xenon (Xe) gas is added to $C_4F_8$ gas used as an etching gas in order to prevent a damage to an underlying silicon film. However, Reference 2 does not consider the problems occurring when the interval between the holes is narrowed, the selectivity problem and the problem occurring in case of etching a SiCOH film.

SUMMARY OF THE INVENTION

Accordingly, the present invention strives to solve the problems occurring in case of etching, for example, an insulating film containing silicon and oxygen by using an active species generating gas including a compound having carbon and fluorine. It is, therefore, an object of the present invention to provide, in case of performing an etching on a substrate having a resist mask on which an interval between neighboring openings formed is set to be 200 nm or less, a plasma etching method capable of suppressing an undulation of inner peripheral surfaces of the openings of the resist mask and reducing a striation at etched portions, thereby improving the processed shape thereof. It is another object of the present invention to provide a plasma etching method for etching an insulating film containing silicon and oxygen, deposited on an under film serving to stop the etching, by using a plasma generated from a compound having carbon and fluorine, wherein a widening of an upper portion of a recess can be suppressed and a high selectivity of an insulating film against an under film can be obtained.

In accordance with the present invention, there is provided a plasma etching method for performing a plasma etching on a substrate having a pattern wherein an interval between neighboring openings formed on a resist mask is equal to or less than 200 nm, wherein the etching is performed by converting a processing gas comprising an active species generating gas which includes a compound having carbon and fluorine, and a nonreactive gas which includes xenon gas into a plasma.

The recesses may be, for example, grooves for use in forming a wiring as well as holes for burying capacitance devices, contact holes, etc. The active species generating gas having a compound containing carbon and fluorine may be, for example, a CF based or a CHF based gas. The CF based gas may be $C_4F_8$ gas, $C_4F_6$ gas, $C_5F_8$ gas, and the like, as shown in the following description of examples, without being limited thereto.

One of the reasons for using the nonreactive gas is that the nonreactive gas serves to increase active species required in the etching. In accordance with the present invention, the undulation of the inner peripheral surfaces of the openings can be suppressed by using Xe (xenon) gas even in case the interval between the openings of the resist mask is very small, i.e., 200 nm or less, as will become apparent from the following description of examples. The reason for this is not definite, but it is conjectured that the use of the Xe gas reduces a degree of dissociation for generating active species from the compound having carbon and fluorine, to thereby suppress a generation of fluorine radicals with a high activity, that is, unnecessary active species, thus weakening a reaction on the resist.

The nonreactive gas may be a gaseous mixture of, for example, Xe gas and Ar (argon) gas. Since the Ar gas has a function of increasing the active species and thus can be used to increase the etching rate of a portion to be etched, it is preferable to use the Ar gas mixed with the Xe gas with controlling the mixture ratio thereof. It is preferable that the ratio of a flow rate of the Xe gas to a total flow rate of the Xe gas and the Ar gas (Xe+Ar) be equal to or greater than 0.1. Furthermore, if the flow rate of the Xe gas is increased, the etching rate of the portion to be etched is reduced although the undulation problem may be ameliorated. Therefore, it is preferable to set the mixture ratio to obtain a balance of the two aspects. Moreover, the processing gas preferably includes oxygen gas. By mixing the oxygen gas, an effect of removing carbon based deposits can be obtained.

In accordance with the present invention, there is further provided a plasma etching method for performing a plasma etching on an insulating film, which includes silicon and oxygen and is deposited on an under film, wherein the etching is performed by converting a processing gas comprising an active species generating gas which includes a compound having carbon and fluorine, and a nonreactive gas which includes argon gas and xenon gas, into a plasma. The film including silicon and oxygen, for example, the insulating film, may be a hydrogenated silicon oxycarbide (hydrogenated silicon oxycarbonate) film (SiCOH film). The under film is, for example, selected from the group consisting of a silicon carbide film, a silicon nitride film, a silicon oxynitride film (SiON film) and a silicon oxycarbide (silicon oxycarbonate) film (SiCO film). The active species generating gas may be, for example, $C_4F_8$ gas, $CHF_3$ gas, or the like.

BRIEF DESCRIPTION OF THE DRAWINGS

FIG. 4 provides plan views of holes of $SiO_2$ film and cross sectional views of resist masks in respective examples in accordance with the examples 1;

FIGS. 12A and 12B disclose selectivities obtained at a dense pattern region and a sparse pattern region of each of a central portion and a peripheral portion of a wafer;

DETAILED DESCRIPTION OF THE PREFERRED EMBODIMENTS

Figure 1:
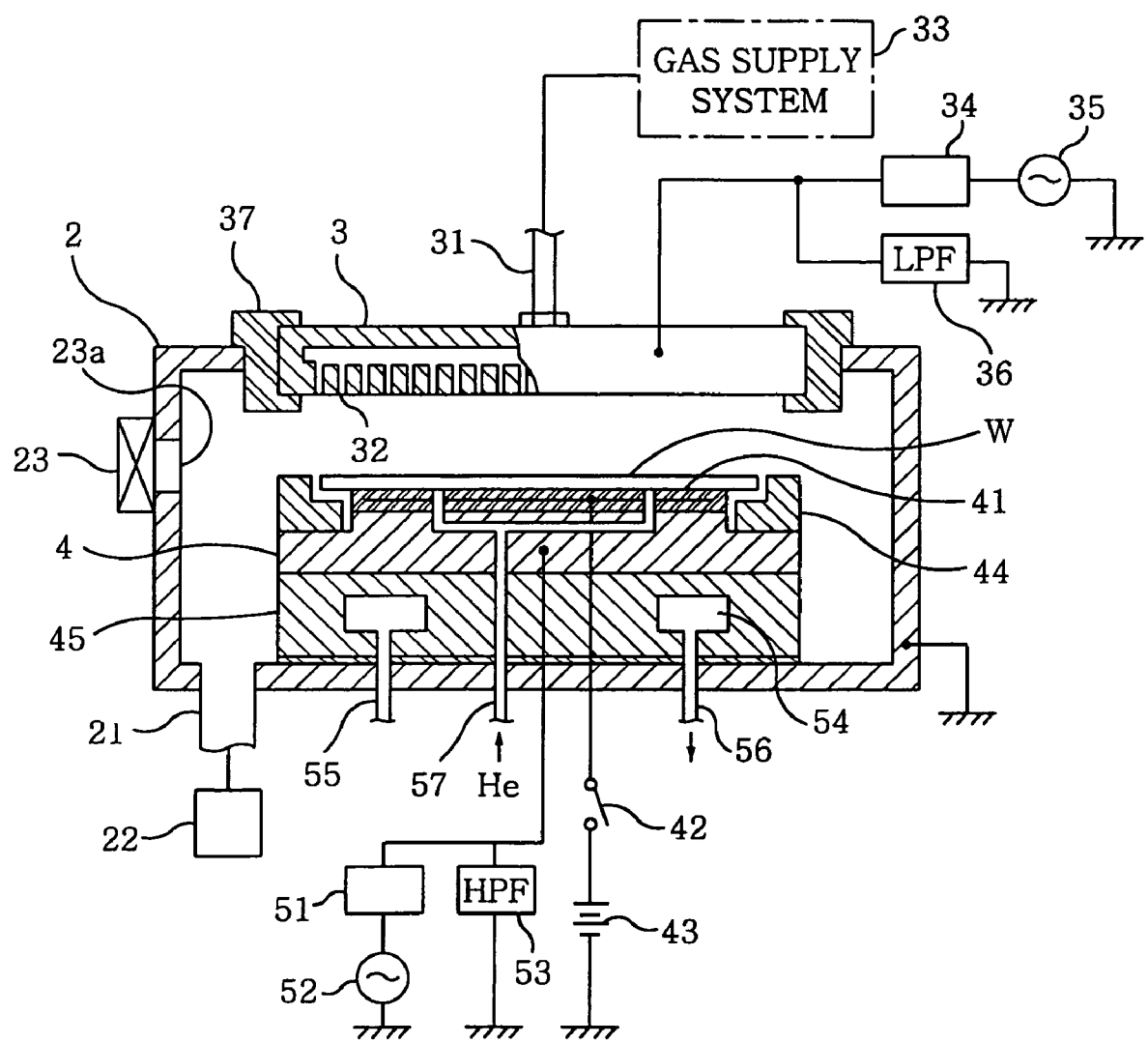
FIG. 1 presents a vertical cross sectional view of a plasma processing apparatus for use in the preferred embodiments of the present invention.

A plasma processing apparatus for use in performing a plasma etching method in accordance with the present invention will be first described with reference to FIG. 1. In FIG. 1, reference numeral 2 represents a processing chamber hermetically formed of a conductive material such as aluminum. The processing chamber 2 is grounded. An upper electrode 3 also serving as a gas shower head for supplying a predetermined processing gas and a mounting table 4 also serving as a lower electrode for mounting a semiconductor wafer (hereinafter, refereed to as a wafer) W thereon are disposed in the processing chamber 2 to face each other. Moreover, connected to a bottom portion of the processing chamber 2 is a gas exhaust line 21, which in turn is coupled to a vacuum exhaust unit, for example, a vacuum pump 22 such as a turbo molecular pump and a dry pump. Further, provided at a sidewall of the processing chamber 2 is an opening 23a through which the wafer W is loaded or unloaded from the processing chamber 2, wherein an openable and closable gate valve 23 is installed at the opening 23a.

A plurality of gas diffusion holes 32 communicated with a gas supply line 31 is bored through a lower surface of the upper electrode 3 and is configured to supply a processing gas toward the wafer W loaded on the mounting table 4. Furthermore, a base side of the gas supply line 31 is connected to a gas supply system 33, which includes gas supply sources and control devices such as valves and mass flow controllers. For example, the gas supply system 33 is configured to supply a CF based gas, Ar gas, Xe gas, $O_2$ gas, and the like, via the gas supply line 31 while mixing them at their respective predetermined flow rates.

Further, connected to the upper electrode 3 are a low pass filter 36 and a high frequency power supply unit 35 for supplying a high frequency power via a matching unit 34. In addition, an annular shield ring 37 is fitted around the outer peripheral portion of the upper electrode 3.

The mounting table 4 is formed of a conductive material, e.g., aluminum, and an electrostatic chuck 41 is disposed on a top surface of the mounting table 4. The electrostatic chuck 41 attracts and holds the wafer W by an electrostatic attractive force when a DC power is applied from a DC power supply unit 43 which is connected to the electrostatic chuck 41 via a switch 42. Further, a focus ring 44 is installed around the electrostatic chuck 41 to surround the wafer W maintained on the electrostatic chuck 41.

Moreover, connected to the mounting table 4 are a high pass filter 53 and a high frequency power supply unit 52 for supplying a bias voltage via a matching unit 51. Further, disposed under the mounting table 4 is a supporting body 45 formed of, e.g., aluminum, and formed within the supporting body 45 is a temperature control fluid path 54 serving as a temperature control unit for allowing a coolant, which is a temperature control medium, to flow therethrough. Reference numeral 55 refers to a coolant inlet path while reference numeral 56 represents a coolant outlet path. Further, reference numeral 57 represents a heat transfer medium supply line for supplying a heat transfer medium, for example, He gas, to a backside of the wafer W through the mounting table 4, the supporting body 45 and the electrostatic chuck 41. Heat is transferred from the mounting table 4 to the wafer W via the heat transfer medium, so that the wafer W is maintained at a predetermined temperature. Further, installed inside the mounting table 4 and the supporting body 45 are elevating pins (not shown) capable of transferring the wafer W from and to a transfer arm (not shown).

Figure 2A:
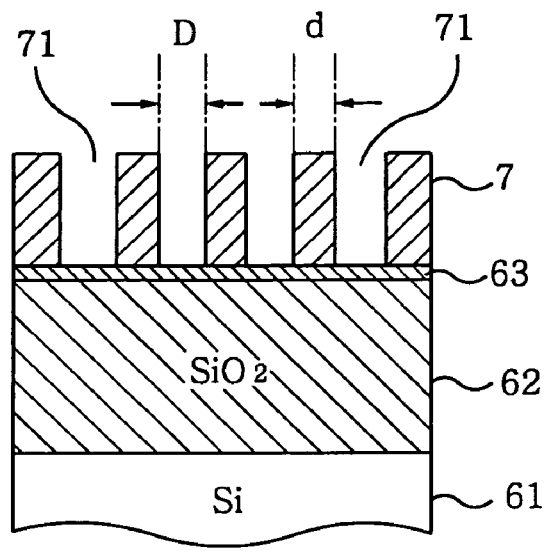
FIGS. 2A and 2B show a surface of a substrate loaded into the plasma processing apparatus and a surface of the substrate obtained after a plasma processing, respectively.

Operating conditions for etching a surface of the wafer W using the above-described plasma processing apparatus will now be explained. FIG. 2A shows a surface of the wafer W serving as a substrate loaded into the plasma processing apparatus. A $SiO_2$ film 62 with a thickness of, e.g., about 2000 nm is deposited on top of a Si (silicon) layer 61, and a resist mask 7 with a thickness of, e.g., about 500 nm is formed on the surface of the $SiO_2$ film via an antireflection film 63 (a film for preventing a reflection during an exposure process) formed of, for example, an organic ARC. The resist mask 7 is provided with a plurality of openings, e.g., holes 71, each having a diameter D ranging from about 100 nm to about 300 nm, wherein an interval d between neighboring holes 71 is set to be 200 nm or less, for example, 100 to 150 nm. These values are just exemplary figures chosen for the purpose of illustrating a preferred embodiment, and, therefore, the present invention is not limited thereto.

Referring back to FIG. 1, the gate valve 23 is first opened and the wafer W is loaded into the processing chamber 2 from a load lock chamber (not shown) to be mounted on the electrostatic chuck 41 of the lower electrode 4. Then, the gate valve 23 is closed, so that the processing chamber 2 is hermetically sealed. Thereafter, the processing chamber 2 is vacuum evacuated by the vacuum pump 22 while concurrently supplying a processing gas at a predetermined flow rate via the gas supply line 31. The processing gas is uniformly injected toward the surface of the wafer W via the gas diffusion holes 32, and the inside of the processing chamber 2 is maintained at a predetermined vacuum level of, for example, tens of mTorr. The processing gas introduced into the processing chamber 2 flows along the surface of the wafer W in a radially outward direction and is exhausted from the periphery of the mounting table 4 uniformly.

With regard to the wafer W illustrated in this example, since the antireflection film 63 is formed on the surface of the $SiO_2$ film 62, the antireflection film 63 is first etched. The etching is performed by concurrently applying predetermined high frequency powers to the upper electrode 3 and the mounting table 4, i.e., the lower electrode from the high frequency power supply units 35 and 52, respectively, while introducing a CF based active species generating gas such as $C_4F_8$ gas, $C_4F_6$ gas and $C_5F_8$ gas, nonreactive Ar gas, and $O_2$ gas into the processing chamber 2.

Figure 2B:
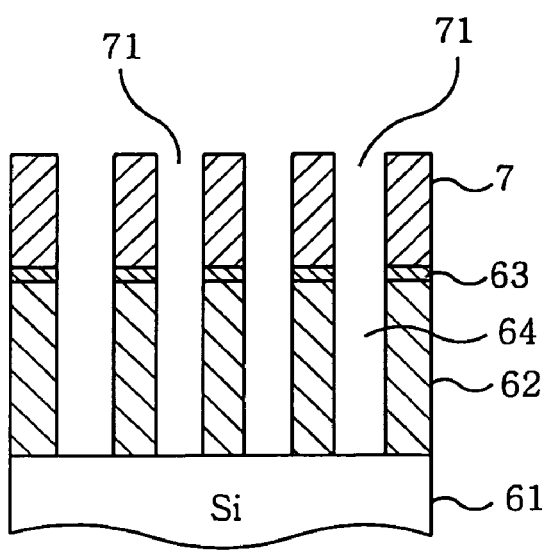

After etching the antireflection film 63, etching of the $SiO_2$ film 62 is performed. Specifically, the etching of the $SiO_2$ film 62 is carried out by applying predetermined high frequency powers to the upper electrode 3 and the mounting table (lower electrode) 4 while concurrently supplying a CF based or CHF based etching gas along with Ar gas and Xe gas. Since proper values for the flow rate of the processing gas would vary with the type of the employed CF based or CHF based gas, the specific values thereof will be exemplarily given in examples to be described later. Further, the temperature of the wafer W is maintained at, for example, about 10 to 40° C. due to a balance kept between a heat from plasma and a heat radiation toward the mounting table 4 while the wafer W is being processed. As a result of performing the etching process as described, the $SiO_2$ film 62 is etched, and holes 64 for, e.g., burying capacitance devices are formed as shown in FIG. 2B. A process for forming the capacitance devices involves the steps of forming a thin dielectric film, e.g., a thin $SiO_2$ film along the inner surface of the holes 64 and burying polysilicon therein to thereby obtain, for example, trench capacitors.

The etching of the $SiO_2$ film 62 will now be described in further detail. The processing gas is converted into a plasma by the energy of the high frequency powers, wherein the Ar gas and the Xe gas tend to be converted into a plasma more readily than, for example, the CF based gas. Thus, the conversion of the CF based gas into a plasma can be facilitated also by the energy of the plasma of these nonreactive gases, to thereby generate radicals, such as $CF_2^*$, $C_2F_4^*$, and the like, or ionic species, which are active species useful for etching. Further, since the Ar gas facilitates a dissociation of the CF based gas to a great degree, performing the dissociation only with the Ar gas may result in an excessively strong reaction of the active species on the resist mask 7 in case the holes 71 are densely formed with an interval of 200 nm or less. Accordingly, the inner peripheral surfaces of the holes 71 may become undulated and angled portions of the resist mask 7 in the upper portions of the holes 71 may be cut off severely. In addition, since the cuttings of the resist mask 7 at both sides act synergically, reduction in the height thereof may also follow. In contrast, if the holes 71 are distant from each other, even in case only the Ar gas is employed as a nonreactive gas, the undulation does not occur substantially and the shapes of the holes remain relatively regular even though the angled portions are cut off. It is apparently due to the fact that the dissociation of the CF based gas generates F radicals at an amount which causes no problem when the holes are distant from each other but causes adverse effects when the holes are closely distributed.

By adding the Xe gas as another nonreactive gas in this preferred embodiment, it is possible to suppress the occurrence of undulation of the holes 71. Such result is obtained apparently due to the fact that the electron temperature of the plasma of the Xe gas is lower than that of the Ar gas, which contributes to reducing the dissociation degree of the CF based gas. Thus, by adjusting the flow rates of the Ar gas and the Xe gas, the dissociation degree of the active species can be optimized for the etching; and a proper etching rate of the $SiO_2$ film 62 can be obtained while reducing the etching rate of the resist mask 7. As a result, the inner surfaces' undulation of the holes 71 of the resist mask 7 can be suppressed and the cutting off of the angled portions can be reduced. Therefore, striation of the holes 64 of the $SiO_2$ film 62 can be suppressed to improve the processed shape of the holes 64. As a result, design values for capacitance with regard to, e.g., the capacitance devices buried in the holes 64 can be obtained, thereby increasing yields.

Furthermore, since the Ar gas serves to remove a fluorocarbon film, deposited on portions where $SiO_2$ is exposed, by a sputtering effect, it has an effect of increasing the release property of etching openings (i.e., preventing an etch stop) in addition to facilitating the dissociation of the CF based gas. Moreover, the $O_2$ gas serves to eliminate carbon based deposits piled on portions where $SiO_2$ is exposed.

Further, as a nonreactive gas in accordance with the present invention, a mixture of the Xe gas and a nonreactive gas other than the Ar gas can be also used; while it is also possible to use the Xe gas only. Moreover, the material to be etched is not limited to the $SiO_2$ film but can be, for example, SiOC, SiCOH (silicon oxide film to which carbon and hydrogen are added), or the like. Further, the present invention is not limited to the case where all the intervals between neighboring openings of the resist mask are equal to or less than 200 nm but can also be applied to a case where those patterns with openings spaced apart from each other at an interval of 200 nm or less and those patterns with openings spaced apart from each other at an interval greater than 200 nm coexist. Moreover, the apparatus for performing the etching method of the present invention is not limited to a parallel plate type plasma processing apparatus but can be, for example, an apparatus for generating plasma by introducing a microwave into a processing chamber via an antenna, an apparatus for generating plasma by using electron cyclotron resonance, or the like.

Figure 9A:
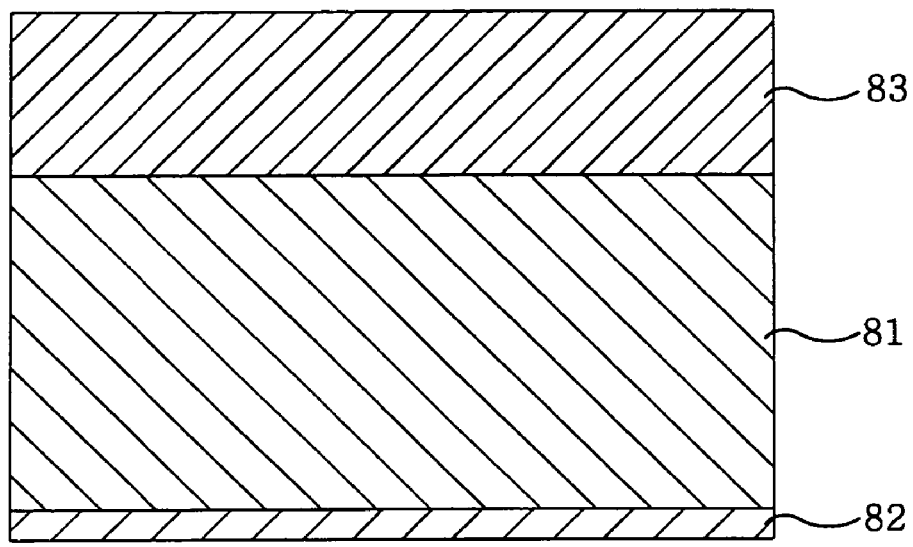
FIGS. 9A and 9B offer cross sectional views of a surface structure of a substrate for use in a preferred embodiment of the present invention.
Figure 9A:
Figure 9B:
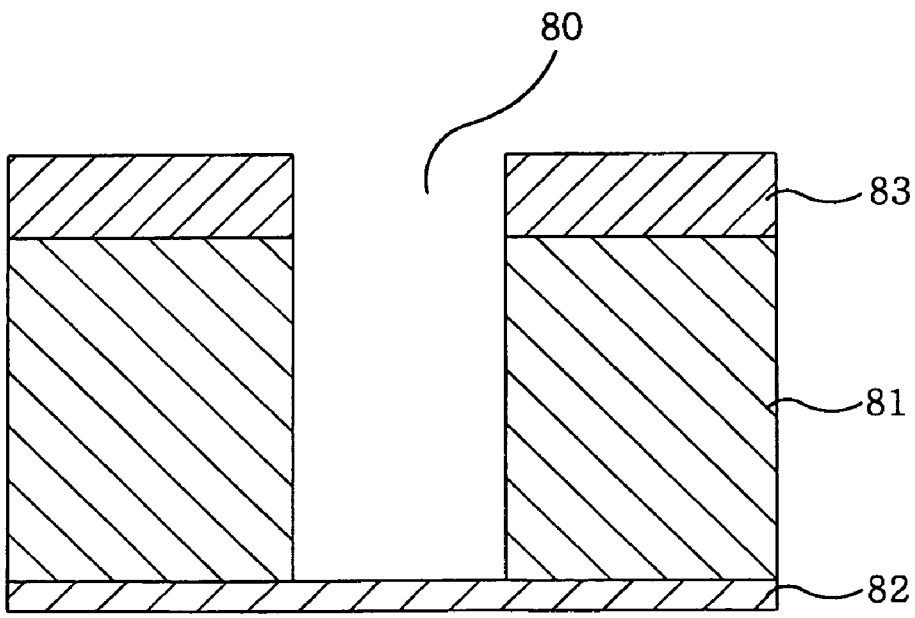

In case of etching a film containing silicon and oxygen, e.g., a SiCOH film, by using an etching gas containing carbon and fluorine, it is effective to use a gaseous mixture of Ar gas and Xe gas. FIGS. 9A and 9B show a behavior to form a recess 80 for a via hole in a SiCOH film 81. In the drawing, reference numeral 82 represents an under film formed of, for example, SiC, and the under film 82 is prepared as a stop layer (etching stop film). That is to say, the under film 82 serves to stop the etching at the moment the etching has progressed up to the bottom surface of the SiCOH film 81, to thereby prevent a continuation of the etching below the SiCOH film 81. Further, reference numeral 83 represents a resist mask.

For the substrate surface with the above-explained configuration, if the SiCOH film 81 is etched as described above, widening of an inner periphery of an upper portion of the hole 80 of the SiCOH film 81 can be suppressed and the selectivity of the SiCOH film 81 against the under film 82 (an etching rate of the SiCOH film/an etching rate of the under film) can be increased, as can be seen from experiment results to be described later. The reason for this is not definite yet; however, it is conjectured that the dissociation degree of the CF based gas is reduced because the electron temperature of the plasma of the Xe gas is lower than that of the Ar gas and the reduction in the dissociation degree weakens the etching of the upper portion of the hole of the SiOCH film 81 and the etching of the under film 82.

Further, it is also conjectured that, by mixing the Xe gas with the Ar gas, the gaseous mixture may be incident on the film with a high verticality because the Xe gas is weighty, to thereby suppress a sputtering of the mask in a horizontal direction or that generation of fluorine radicals having a great effect of isotropic etching may be suppressed because the dissociation degree of the CF based gas is reduced, as described above. That is, it is believed that the widening of the inner periphery of the upper portion of the hole of the SiCOH film 81 is resulted from the phenomenon that the active species for the etching lose a place to go to due to the exposure of the under film, while cutting the inner periphery of the mask above it, thereby widening the opening of the mask. Thus, by adding the Xe gas, the effect of cutting the inner periphery of the mask after the exposure of the under film can be diminished.

Moreover, the insulating film containing silicon and oxygen is not limited to the SiCOH film but can be a SiCO film. Furthermore, the under film is not limited to the silicon carbide film but can be any one of a silicon nitride film, a SiON film and a SiCO film.

In accordance with the preferred embodiment of the present invention as described above, the widening of the upper portions of the recesses of the SiCOH film are suppressed. Thus, in case it is applied on an etching of, for example, via holes, generation of capacitance components between the via holes is suppressed, so that the problem of delaying a signal transfer can be avoided. Moreover, since the etching of the under film is suppressed, i.e., since the selectivity of the etching of the SiCOH film against the under film is great, the problem of etching the underlying wiring through the under film can be averted, so that high in-surface uniformity of resistance of the via holes can be obtained, resulting in an increase of yields.

EXPERIMENTS

Experiments intended to illustrate the remarkable effect of the present invention will now be described.

Experiment 1

Figure 3:
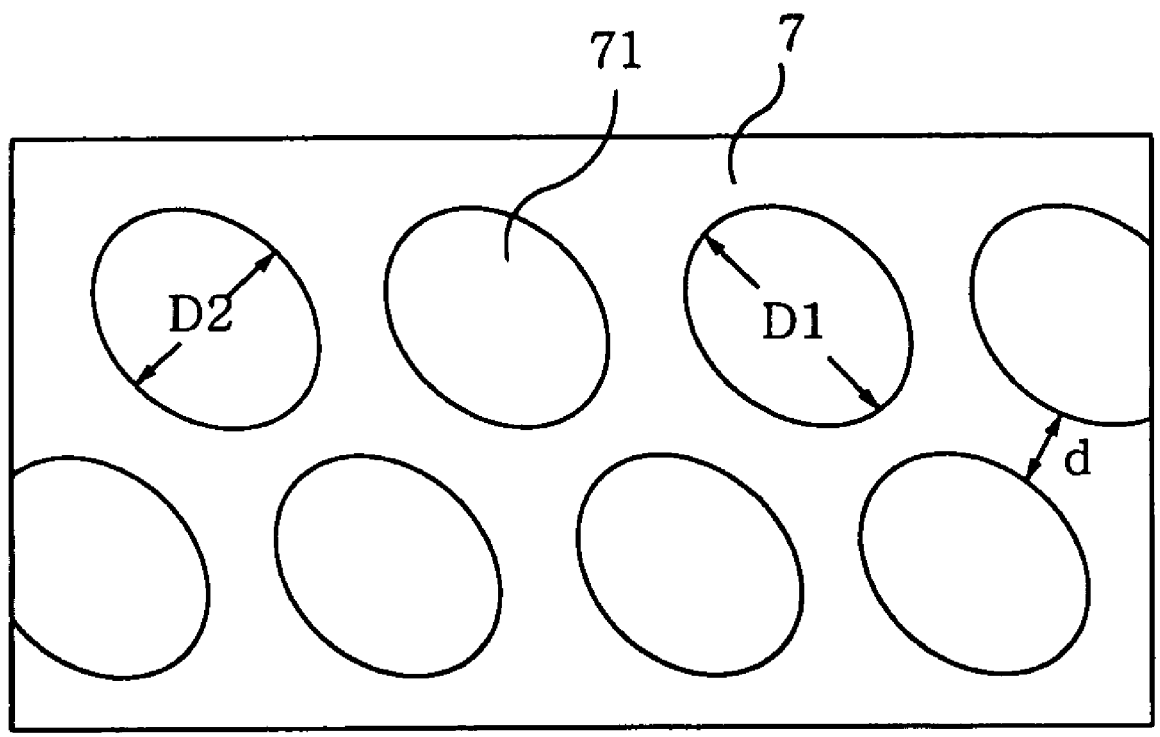
FIG. 3 sets forth a plan view showing an arrangement pattern of holes of a resist mask on a substrate employed in examples 1.

An etching was conducted on a wafer having a surface layer as shown in FIGS. 2A and 2B by using the plasma processing apparatus shown in FIG. 1, wherein holes 71 of a resist mask 7 were arranged in a zigzag pattern and each had an elliptical shape, as shown in FIG. 3. The film thickness of the resist mask 7 was 500 nm; the longer diameter D1 and the shorter diameter D2 of each hole 71 were 300 nm and 250 nm, respectively; and an interval d between the holes 71 was 100 nm. Further, a $SiO_2$ film 62 to be etched was formed of a TEOS raw material to have a thickness of 2000 nm by a CVD. The processing conditions were as follows:

a. Processing conditions for etching an antireflection film the high frequency power of the upper electrode:
   60 MHz, 1500 W the high frequency power of the lower electrode:
   2 MHz, 400 W the processing pressure: 3.3 Pa (25 mTorr) the processing gas: $CF_4/Ar/O_2$=70/750/15 sccm
b. Processing conditions for etching the $SiO_2$ film the high frequency power of the upper electrode:
   6 MHz, 3000 W the high frequency power of the lower electrode:
   2 MHz, 3300 W the processing pressure: 5.3 Pa (40 mTorr) the processing gas: $C_4F_8/Ar/Xe/O_2$=35/specified below/specified below/27 sccm.

Since the flow rates of Ar and Xe are varied in respective examples, specific values thereof will be mentioned in each of the examples.

A. COMPARATIVE EXAMPLE 1

Under the above processing conditions, the flow rates of Ar and Xe were set to be 1400 sccm and 0, respectively.

B. EXAMPLE 1-1

Under the above processing conditions, the flow rates of Ar and Xe were set to be 1250 sccm and 150 sccm, respectively.

C. EXAMPLE 1-2

Under the above processing conditions, the flow rates of Ar and Xe were set to be 1150 sccm and 250 sccm, respectively.

D. EXAMPLE 1-3

Under the above processing conditions, the flow rates of Ar and Xe were set to be 1050 sccm and 350 sccm, respectively.

E. EXPERIMENTAL RESULTS

In each example, the shapes of holes 64 formed on the surface of the $SiO_2$ film 62 were inspected through the use of a SEM (Scanning Electron Microscope) by removing the resist mask 7 after completing an etching of the $SiO_2$ film 62, and a selectivity was obtained from the film thickness of the residual resist mask 7 and the depths of the holes 64 by way of halting the process in the middle of etching the $SiO_2$ film. Further, the etching of the $SiO_2$ film 62 was continued even after reaching a calculated end point, that is, an overetching was conducted.

FIG. 4 visualizes the experimental results, wherein the drawings are based on the pictures of top surfaces and cross sections obtained by the SEM. From the observation of the pictures, it can be found that the shapes of the holes 64 were poor in case of using the Ar gas only as the nonreactive gas without adding the Xe gas, which means that striation occurred at the inner peripheral surfaces of the holes 64. It, therefore, appears that undulation of the inner peripheral surfaces of the holes 71 of the resist mask 7 occurred and was transferred to the holes 64 of the $SiO_2$ film 62. Further, the cross section of the resist mask 7 showed rough sidewalls, large faults caused by the cutting of angled portions, and so forth. In contrast, in case of adding the Xe gas, the irregularities in the shape of the holes 64 were reduced and, at the same time, the cross section of the resist mask 7 was improved. This effect was augmented as the flow rate of the Xe gas increased.

Meanwhile, the selectivity was calculated to be 2.4 in the case of not adding the Xe gas, while the selectivity was found to be 4.0, 4.1 and 3.7 in cases of using the Xe gas whose flow rate was set to be 150 sccm, 250 sccm and 350 sccm, respectively. Moreover, the selectivities were obtained at both of a central portion and a peripheral portion of the wafer in the experiment. Though FIG. 4 only shows values obtained at the central portion of the wafer, such tendency of selectivity was also found in the peripheral portion of the wafer. Given that a maximum level of selectivity was obtained when the flow rate of the Xe gas was 250 sccm in this experiment, it can be concluded that the selectivity increases as the flow rate of the added Xe gas increases but decreases when the ratio of a flow rate of the Xe gas to a total flow rate of the Ar gas and the Xe gas (Xe/(Xe+Ar)) exceeds a specific value. As for one reason for this, it is conjectured that the dissociation degree of the $C_4H_8$ gas decreases as the Ar gas proportion is reduced, resulting in a reduction in the etching rate of the $SiO_2$ film 62. Accordingly, this experiment reveals that the prevention of striation and the etching rate are in a relationship of trade-off. In Experiment 1, a desired control of striation and a desired etching rate can be obtained within a range of $0.1 \leq Xe/(Xe+Ar) \leq 0.25$.

Experiment 2

Experiment 2 is identical to Experiment 1 excepting that $C_4F_6$ gas was used as the CF based gas in lieu of the $C_4F_8$ gas and the flow rate of the $O_2$ gas was set to be 55 sccm. The same tendency as that in Experiment 1 was observed in this experiment in terms of the shapes of the holes 64 of the $SiO_2$ film 62 and the cross sectional shape of the resist mask 7. However, given that the selectivity was 5.4, 6.6, 5.8 and 6.2 when the flow rate of the Xe gas was 0, 150 sccm, 250 sccm and 350 sccm, respectively, it was revealed that the Xe gas proportion in the nonreactive gases for obtaining a maximum selectivity varies depending on the type of the gas.

Experiment 3

The etching experiment was conducted by using $C_5F_8$ gas as the CF based gas in lieu of the $C_4F_8$ gas. However, instead of comparing a case employing the Xe gas with a case not employing it, this experiment was performed by varying parameters at a state where the Xe gas was employed. Specifically, $C_5F_8/Xe/O_2$ were set to be 24/175/40 sccm and the flow rate of the Ar gas was varied within a range from 525 sccm to 825 sccm. Further, the processing pressure was determined within a range from 2.6 Pa (20 mTorr) to 4 Pa (30 mTorr) and the high frequency power of the lower electrode was varied within a range from 3000 W to 3800 W. In any of such various cases, the shapes of the holes 64 of the $SiO_2$ film 62 and the cross sectional shape of the resist mask 7 were found to be good, and substantially no difference was observed within the ranges where the parameters were varied. From this result, it was revealed that the same effect can be obtained in case of the $C_5F_8$ gas.

Experiment 4

Figure 5:
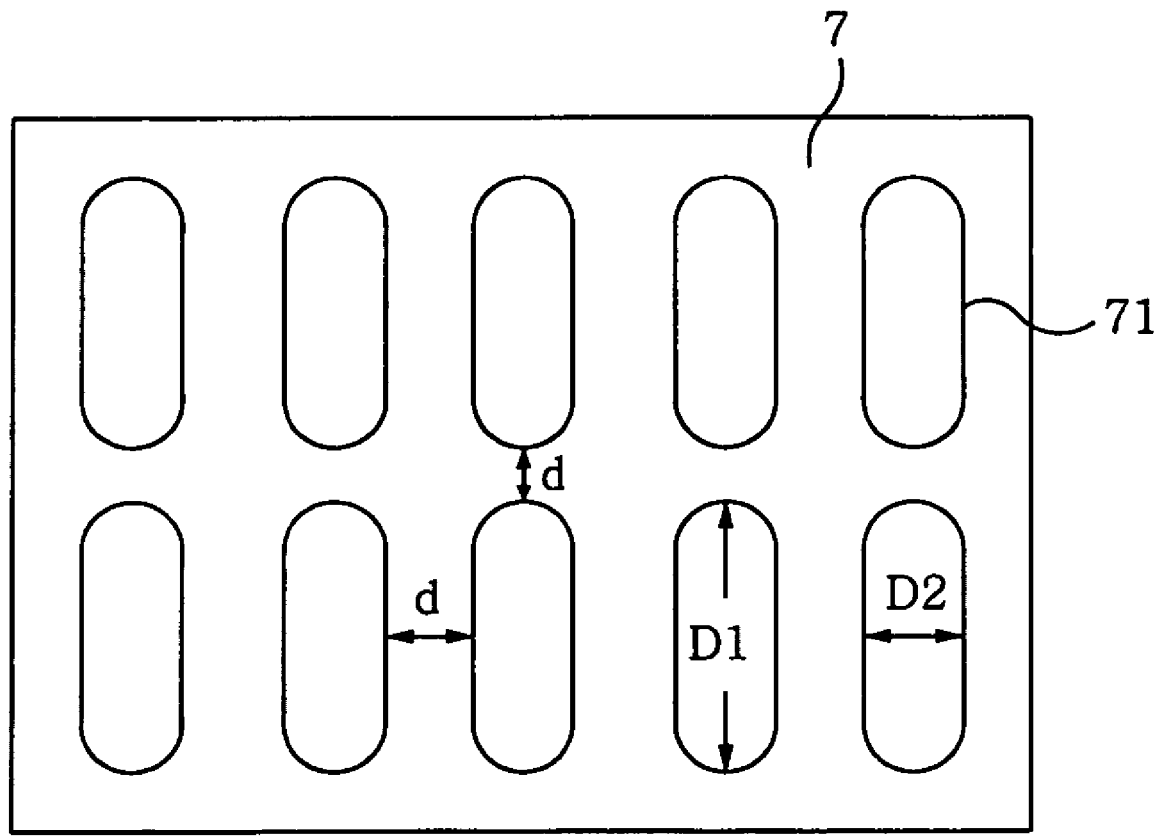
FIG. 5 describes a plan view showing an arrangement pattern of holes of a resist mask on a substrate employed in examples 4.
Figure 6A:
FIGS. 6A to 6D represent drawings showing plan views of holes of $SiO_2$ films in respective examples in accordance with the examples 4.
Figure 6B:
Figure 6C:
Figure 6D:
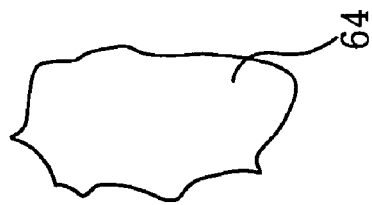

The same etching was conducted on a wafer on which holes 71 of a resist mask 7 were elongated hole-shaped and arranged in a horizontal and a vertical directions, as shown in FIG. 5. The vertical diameter D1 and the horizontal diameter D2 of each hole 71 were 300 nm and 150 nm, respectively, and an interval d between the holes 71 was 120 nm. Furthermore, the film thickness of the resist mask 7 was 400 nm and a portion to be etched was formed of a BPSG film (silicate glass film doped with boron and phosphorus) which was 2000 nm thick. The processing conditions were as follows, in which the frequencies of the high frequency powers were not specified because they were identical to those in Experiment 1.

a. Processing conditions for etching an antireflection film
the high frequency power of the upper electrode:
1000 W the high frequency power of the lower electrode: 750 W the processing pressure: 6.7 Pa (50 mTorr) the processing gas: $CHF_3/CH_2F_2/Ar/O_2$ =20/35/300/15 sccm b. Processing conditions for etching the BPSG film the high frequency power of the upper electrode:
1600 W the high frequency power of the lower electrode: 1500 W the processing pressure: 3.6 Pa (27 mTorr) the processing gas: $C_4F_8/Ar/Xe/O_2$=48/specified below/specified below/18 sccm.

Since the flow rates of Ar and Xe were varied in the respective examples, the specific values thereof will be mentioned in each of the examples.

A. COMPARATIVE EXAMPLE 4

Under the above processing conditions, the flow rates of Ar and Xe were set to be 600 sccm and 0, respectively.

B. EXAMPLE 4-1

Under the above processing conditions, the flow rates of Ar and Xe were set to be 480 sccm and 120 sccm, respectively.

C. EXAMPLE 4-2

Under the above processing conditions, the flow rates of Ar and Xe were set to be 450 sccm and 150 sccm, respectively.

D. EXAMPLE 4-3

Under the above processing conditions, the flow rates of Ar and Xe were set to be 420 sccm and 180 sccm, respectively.

E. EXPERIMENTAL RESULTS

In each example, the same observation as that of Experiment 1 was conducted, and the selectivity was obtained at a central portion of the wafer. FIGS. 6A to 6D are represent the shapes of holes formed on the BPSG film viewed from the top after removing the resist mask, wherein the drawings are based on pictures obtained by an SEM. Further, the drawings also specify selectivities. From the observation of the pictures, the same results as those of the experiment 1 were attained. That is to say, the shapes of holes 64 were poor and a striation occurred in case of using only the Ar gas as the nonreactive gas without adding the Xe gas. However, in case of adding the Xe gas, the irregularity in the shapes of the holes 64 were reduced and, at the same time, the cross sectional shape of the resist mask 7 was improved. This effect was augmented as the flow rate of the Xe gas increased. Furthermore, though the selectivity increased with the addition of the Xe gas, it is notable that it decreased when the ratio of the flow rate of the Xe gas to the total flow rate of the Ar gas and the Xe gas exceeded a specific value; and also that the selectivity was smaller in case of using the Xe gas with the flow rate of 180 sccm than in case of using the Xe gas with the flow rate of 150 sccm.

Experiment 5

The etching was conducted on the same wafer as used in Experiment 4. In this experiment, the etching was performed through two steps in order to linearize a depth-directional shape of a hole. The processing conditions for etching an antireflection film were identical to those of Experiment 4; and the etching of the BPSG film was carried out under the following processing conditions:

a. Plasma ignition process the high frequency power of the upper electrode:
1800 W the high frequency power of the lower electrode: 0 W the processing pressure: 3.6 Pa (27 mTorr) the processing gas: $C_4F_8/Xe/Ar/O_2$=48/120/480/18 sccm the processing period: 5 seconds.

b. First etching process
The etching was conducted for 120 seconds under the same processing conditions as those of the plasma ignition process excepting that the high frequency power of the lower electrode was set to be 1500 W.

c. Second etching process the high frequency power of the upper electrode:
1800 W the high frequency power of the lower electrode: 1800 W the processing pressure: 2.7 Pa (20 mTorr) the processing gas: $C_4F_6/CF_4/Xe/Ar/O_2$=21/7/specified below/specified below/19 sccm.

Since the flow rates of Ar and Xe were varied in the respective examples, the values thereof will be mentioned in each of the examples.

A. COMPARATIVE EXAMPLE 5

Under the above processing conditions, the flow rates of Ar and Xe were set to be 500 sccm and 0, respectively.

B. EXAMPLE 5-1

Under the above processing conditions, the flow rates of Ar and Xe were set to be 450 sccm and 50 sccm, respectively.

C. EXAMPLE 5-2

Under the above processing conditions, the flow rates of Ar and Xe were set to be 400 sccm and 100 sccm, respectively.

D. EXAMPLE 5-3

Under the above processing conditions, the flow rates of Ar and Xe were set to be 375 sccm and 125 sccm, respectively.

E. EXPERIMENTAL RESULTS

In each example, the same observation as that of the examples 1 was conducted, and the selectivity was obtained at a central portion of the wafer. From the observation of pictures, the same results as those in the experiment 1 were obtained and it was proved that the addition of the Xe gas improves the shapes of holes 64. Furthermore, the etching rates of the resist in Comparative example 5 and the Examples 5-1 to 5-3 were measured to be 63 nm/mm, 54 nm/mm, 49 nm/mm and 69 nm/mm, respectively, which shows the same tendency.

Experiment 6

Figure 7A:
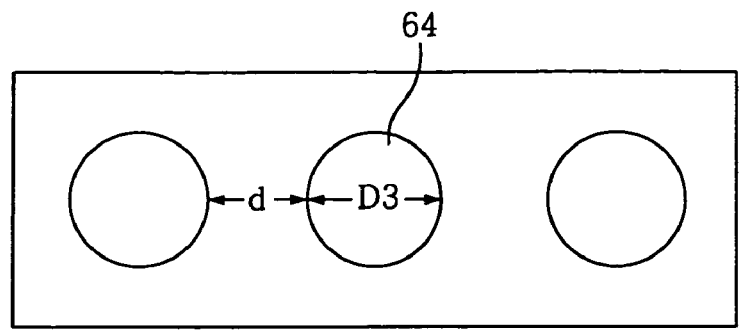
FIGS. 7A to 7C indicate plan views showing an arrangement pattern of holes of a resist mask on a substrate employed in examples 6 and plan views of holes of $SiO_2$ film in respective examples.

The same etching was conducted on a wafer on which circular holes 71 of a resist mask 7 were arranged in a horizontal and a vertical directions, as shown in FIG. 7A. The diameter D3 of each hole 71 was 160 nm and the interval d between the holes 71 was 20 nm. Furthermore, the thickness of the resist mask 7 was 350 nm. Etching was conducted on the $SiO_2$ film formed of a TEOS raw material at the thickness of 2000 nm by a CVD. The processing conditions were as follows:

a. Processing conditions for etching an antireflection film the high frequency power of the upper electrode:
   1500 W the high frequency power of the lower electrode:
   200 W the processing pressure: 20 Pa (150 mTorr) the processing gas: $CF_4/CO$=160/30 sccm b. Processing conditions for etching $SiO_2$ film the high frequency power of the upper electrode:
   2800 W the high frequency power of the lower electrode:
   3800 W the processing pressure: 2.7 Pa (20 mTorr) the processing gas: $C_4F_6/C_4F_8/Ar/Xe/O_2$=35/10/specified below/specified below/44 sccm.

A. COMPARATIVE EXAMPLE 6

Under the above processing conditions, the flow rates of Ar and Xe were set to be 700 sccm and 0, respectively.

B. EXAMPLE 6

Under the above processing conditions, the flow rates of both Ar and Xe were set to be 350 sccm.

C. EXPERIMENTAL RESULTS

Figure 7B:
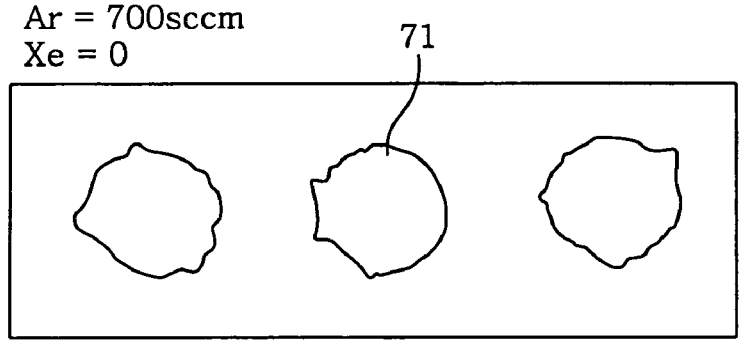
Figure 7C:
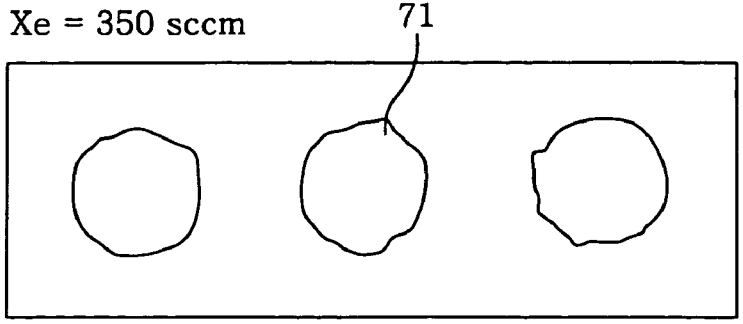

In each example, the same observation as that of the examples 1 was made and the selectivity was obtained at a central portion of the wafer. FIG. 7B and 7C show the shapes of the holes formed on the $SiO_2$ film viewed from the top after removing the resist mask, wherein the drawings were based on the pictures obtained by an SEM. In these examples, it was also found that the shapes of the holes 71 became irregular and a striation occurred at the inner peripheral surfaces thereof in case of using only the Ar gas as the nonreactive gas without adding the Xe gas, whereas the shapes of the holes 64 were improved with the addition of the Xe gas. Furthermore, by adding the Xe gas, the selectivity was improved from 6.8 to 8.0.

Figure 8A:
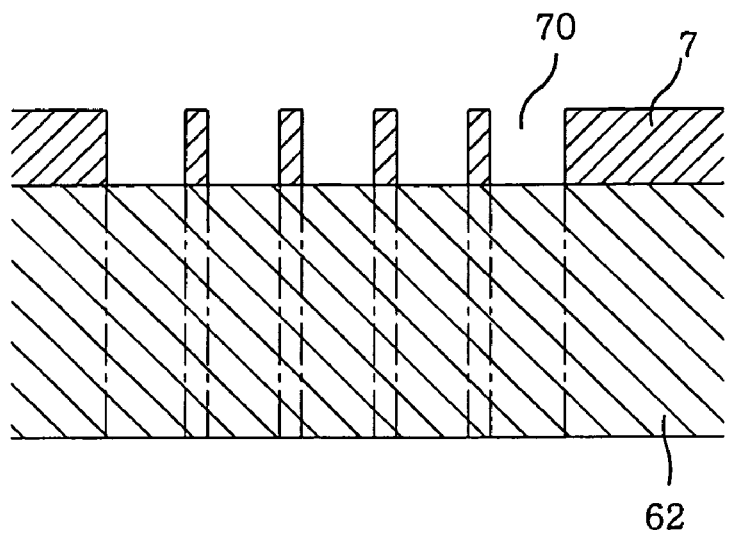
FIGS. 8A and 8B illustrate another example of a pattern shape of a resist mask.
Figure 8B:
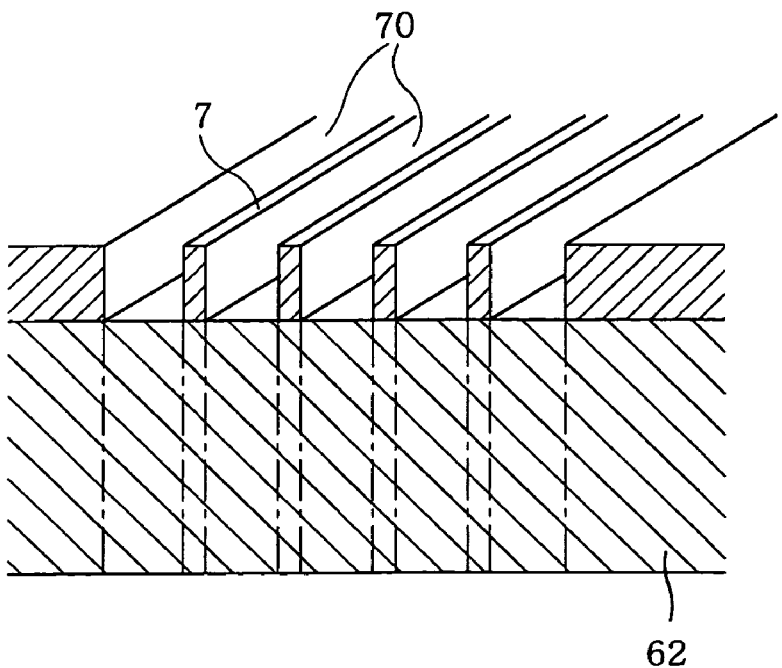

Though these experimental results were obtained for the case where the hole shapes were formed as openings of the resist, the same effect can be obtained with a pattern having grooves 70 formed in a line shape as openings of the resist mask 7, as shown in FIGS. 8A and 8B.

Experiment 7

Experiments 7-1 and 7-2; were conducted by using the apparatus shown in FIG. 1 in order to prove the fact that, in case of etching a SiCOH film, widening of a hole's upper portion can be suppressed and a desirable level of selectivity against a SiC film serving as an under film can be obtained by employing the method of the present invention.

Experiment 7-1

The substrate surface structure used in this experiment is identical to that shown in FIGS. 9A and 9B, wherein a SiC (silicon carbide) film 82, a SiCOH film 81 and a resist film 83 are deposited on a silicon substrate in order. The processing conditions were as follows:

a. Processing conditions for etching the SiCOH film [Processing conditions for the main step] the high frequency power of the upper electrode:
   60 MHz, 400 W the high frequency power of the lower electrode:
   2 MHz, 1500 W the processing pressure: 13.3 Pa (100 mTorr) the processing gas: $CHF_3/Ar/Xe/N_2$=60/specified below/specified below/130 sccm [Processing conditions for the overetching step] the high frequency power of the upper electrode:
   60 MHz, 800 W the high frequency power of the lower electrode:
   2 MHz, 2800 W the processing pressure: 4 Pa (30 mTorr) the processing gas: $C_4F_8/Ar/Xe/N_2$=60/specified below/specified below/180 sccm.

The flow rates of Ar and Xe are specified in each example. Further, the main step schematically refers to a step for etching the SiCOH film 81 while the overetching step refers to a step for etching the SiC film 82 serving as the under film. That is, the etching rates are different at different portions of the SiCOH film 81. Therefore, a portion etched down to the under film earlier is overetched while a portion with the lowest etching rate is still being etched toward the under film. The timing for the switchover between the overetching step and the main step may be set as a previously investigated time point, for example, when the under film below a portion with the highest etching rate is expected to be exposed.

A. COMPARATIVE EXAMPLE 7-1

Under the above processing conditions, the flow rates of Ar and Xe were set to be 1000 sccm and 0, respectively, in both of the main step and the overetching step.

B. EXAMPLE 7-1

Under the above processing conditions, the flow rates of Ar and Xe were set to be 800 sccm and 200 sccm, respectively, in both the main step and the overetching step.

C. EXPERIMENTAL RESULTS

In each example, the shape of holes formed on the SiCOH film 81 were inspected through the use of an SEM by removing the resist mask after the completion of the main step and the overetching step.

Figure 10A:
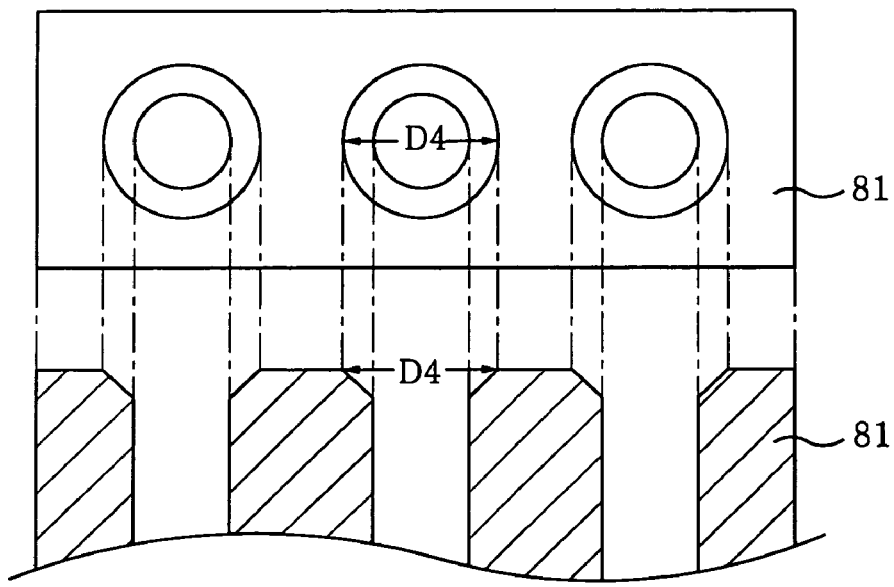
FIGS. 10A and 10B depict plan views and cross sectional views of holes of SiCOH film in comparative example 7 and example 7, respectively.
Figure 10B:
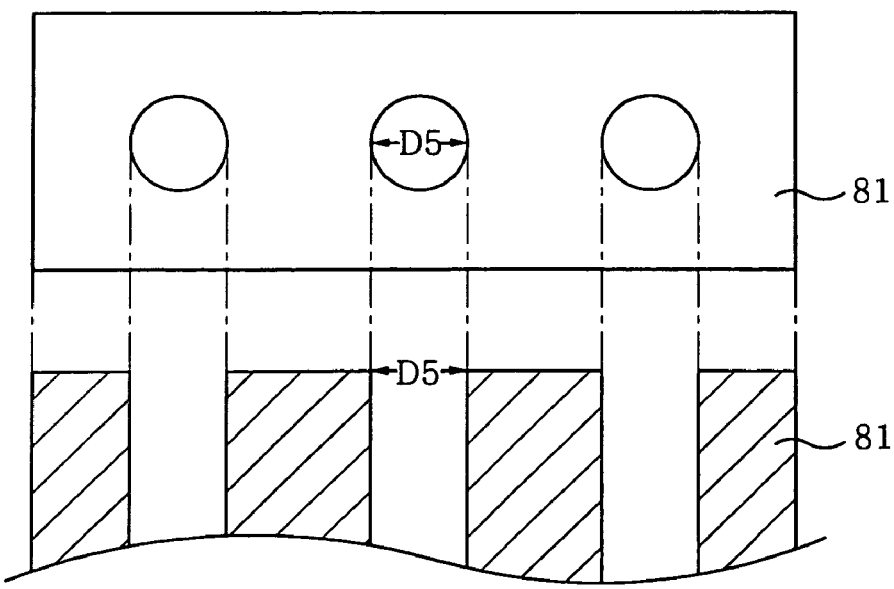

FIGS. 10A and 10B show the experimental results, wherein the drawings are based on the pictures of top views and cross sectional views obtained by the SEM. From the observation of the pictures, in case of using only the Ar gas as the nonreactive gas without adding the Xe gas in both of the main step and the overetching step, the diameter D4 the upper portion of a hole of the SiCOH film 81 was found to be 180 nm, as shown in FIG. 10A. In contrast, in case of using both the Ar gas and the Xe gas in both of the main step and the overetching step, the diameter D5 of a hole of the SiCOH film 81 was 168 nm, as shown in FIG. 10B.

Furthermore, from an observation of the top surface of the substrate before the removal of the resist mask by means of the SEM, it was found that the opening size of the resist mask was enlarged. From this, it can be conjectured that the upper portions of the holes of the SiCOH film 81 were expanded because the opening size of the resist was enlarged. Thus, the widening of the upper portions of the holes of the SiCOH film 81 can be suppressed by using the Xe gas together with the Ar gas.

Experiment 7-2

Figure 11A:
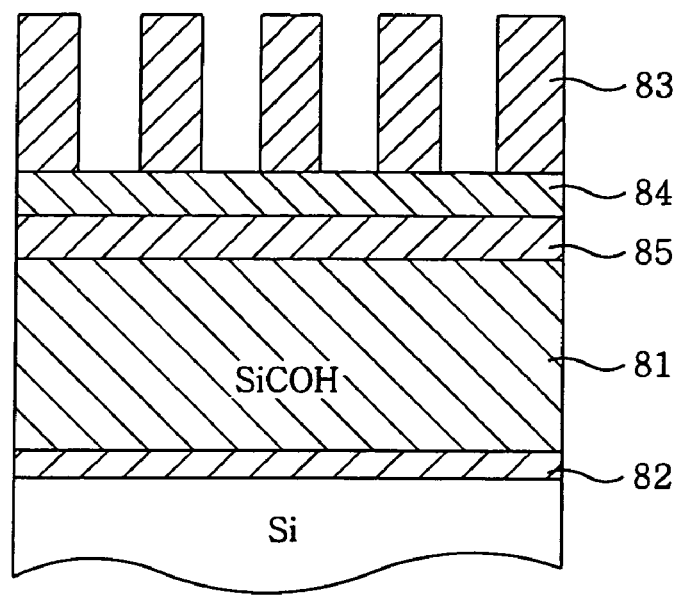
FIGS. 11A and 11B exhibit cross sectional views showing a surface structure of a substrate employed in example 7-2.
Figure 11A:
Figure 11B:
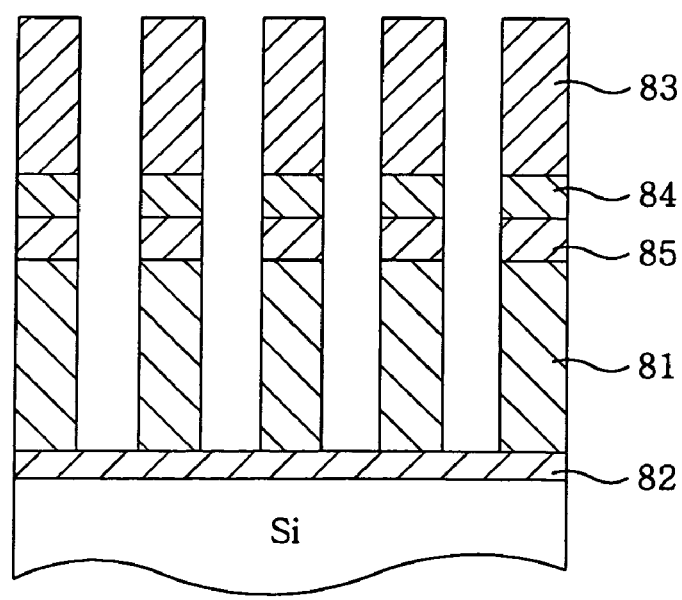
Figure 13:
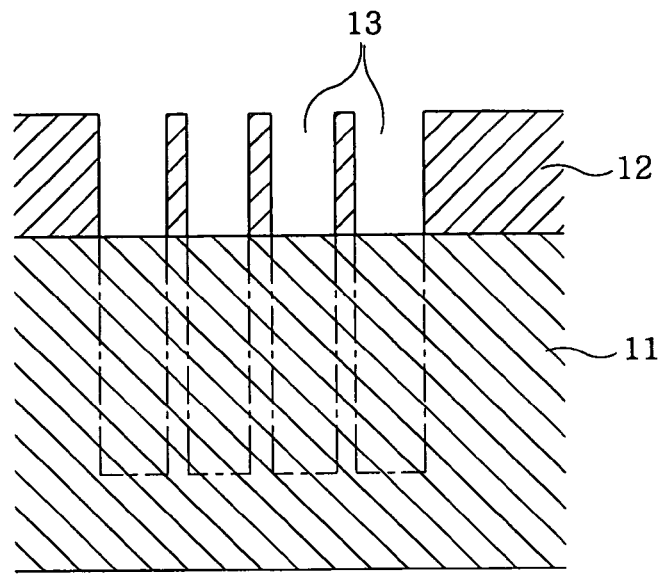
FIG. 13 displays a cross sectional view showing a status where a resist mask is formed on a $SiO_2$ film.
Figure 14:
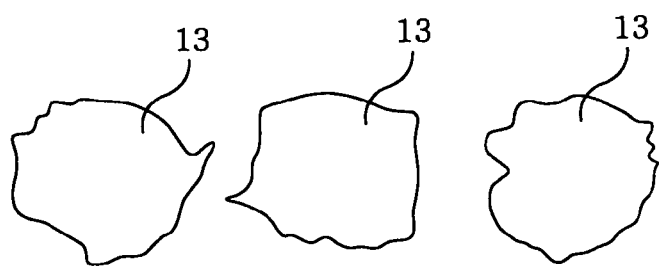
FIG. 14 reproduces plan views showing undulated openings of the resist mask obtained by applying a conventional etching method on the substrate of FIG. 13.
Figure 15:
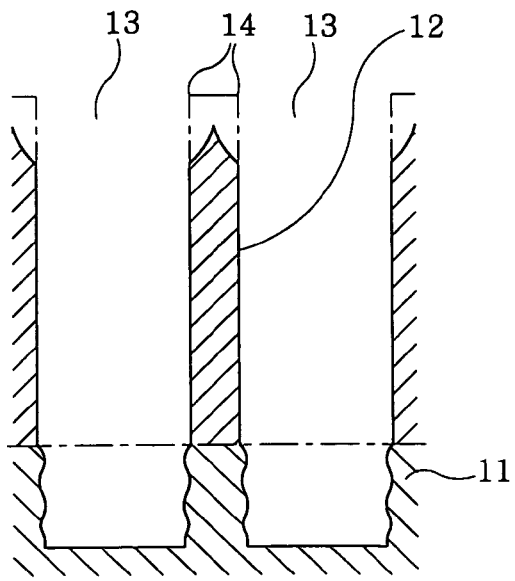
FIG. 15 explains a cross sectional view showing shoulder portions of the resist mask being cut off by applying a conventional etching method on the substrate of FIG. 13.

The substrate surface structure used in this experiment is shown in FIGS. 11A and 11B. Reference numerals 84 and 85 represent the antireflection film and the TEOS film, respectively. The TEOS film 85 is a $SiO_2$ film formed of a raw material of TEOS (tetra ethyl ortho silicate) by a CVD, wherein the TEOS film 85 was formed as a hard mask. That is, since the consumption of the mask is great in case of constituting the mask only with a resist, the hard mask was formed under the resist to constitute multiple layers, thereby reducing the consumption of the mask. In FIGS. 11A and 11B, the thicknesses of the resist film 83, the antireflection film 84, the TEOS ($SiO_2$ film) 85, the SiCOH film 81, the SiC (silicon carbide) film 82 were 380 nm, 65 nm, 50 nm, 360 nm and 50 nm, respectively. The processing conditions were as follows, wherein the processing conditions for etching the antireflection film were omitted since they were identical to those of Experiment 7-1:

a. Processing conditions for etching the SiCOH film

The overetching step was performed following the main step. The selectivity was obtained in the overetching step. [Processing conditions for overetching step] the high frequency power of the upper electrode:

60 MHz, 1500 W the high frequency power of the lower electrode:

2 MHz, 3000 W the processing pressure: 6.7 Pa (50 mTorr) the processing gas: $C_4F_8/Ar/Xe/N_2$=60/specificed below/specified below/200 sccm.

The flow rates of Ar and Xe are specified below in each example.

A. COMPARATIVE EXAMPLE 7-2

Under the above processing conditions, the flow rates of Ar and Xe were set to be 1000 sccm and 0, respectively.

B. EXAMPLE 7-2

Under the above processing conditions, the flow rates of Ar and Xe were set to be 600 sccm and 400 sccm, respectively.

C. EXPERIMENTAL RESULTS

Selectivities at a dense pattern region and a sparse pattern region were obtained at both a central portion and a peripheral portion of the wafer. The results are shown in FIGS. 12A and 12B.

FIG. 12A shows the result obtained at a central portion of the wafer. In case of performing the etching of the SiCOH film 81 by adding the Ar gas and the Xe gas to the $C_4F_8$ gas, selectivities equal to or greater than 20 were obtained at both the dense pattern and the sparse pattern regions. The clause that the selectivities are equal to or greater than 20 implies that no selectivity is less than 20. Since a precise value of the selectivity greater than 20 could not be measured at the central portion of the wafer, specific values were not provided.

Moreover, FIG. 12B shows the result obtained at the peripheral portion of the wafer. In case of performing the etching of the SiCOH film 81 by adding the Ar gas and the Xe gas to the $C_4F_8$ gas, a selectivity of 29.3 was obtained at the dense pattern region while a selectivity of 26.0 was attained at the sparse pattern region.

From the above, it can be understood that a higher selectivity can be obtained as a result of performing an etching of the SiCOH film 81 by adding the Ar gas and the Xe gas to the $C_4F_8$ gas in case the SiC film 82 is formed as an under film of the SiCOH film 81.

In accordance with the present invention, since an active species generating gas including a compound having carbon and fluorine and a nonreactive gas including Xe gas are used, an occurrence of undulation of openings formed on a resist mask can be suppressed in case the interval between neighboring openings is very narrow, i.e., less than 200 nm. Accordingly, the transfer of the undulation of the resist mask to a portion to be etched can be suppressed. Thus, a processed shape can be improved and desired characteristics can be obtained for capacitance devices buried in recesses at the etched portion, wiring, and so forth. With the trend for fine patterns, the present invention can become a useful method to be applied to a design where openings such as holes and grooves are closely formed.

Moreover, by adding argon gas and xenon gas at a time of etching an insulating film containing silicon and oxygen deposited on an under film by using a plasma generated by a compound having carbon and fluorine, widening of an upper portion of a recess can be prevented as will become apparent from the aforementioned examples, and a high selectivity of the insulating film against the under film (etching rate of the insulating film/etching rate of the under film) can be obtained.

While the invention has been shown and described with respect to the preferred embodiments, it will be understood by those skilled in the art that various changes and modifications may be made without departing from the spirit and scope of the invention as defined in the following claims.

What is claimed is:

1. A plasma etching method for performing a plasma etching on a substrate having a pattern wherein an interval between neighboring openings formed on a resist mask is equal to or less than 200 nm, wherein the etching is performed by converting a processing gas comprising an active species generating gas which includes a compound having carbon and fluorine, and a nonreactive gas which includes xenon gas and argon gas into a plasma, wherein the ratio of the flow rate of the xenon gas to the total flow rate of the xenon gas and the argon gas is equal to or greater than 0.1 but not greater than 0.25.

2. The plasma etching method of claim 1, wherein the active species generating gas is a gas selected from the group consisting of $C_4F_8$ gas, $C_4F_6$ gas and $C_5F_8$ gas.

3. The plasma etching method of claim 2, wherein the processing gas further comprises oxygen gas.

4. A plasma etching method for performing a plasma etching on an insulating film, which includes silicon and oxygen and is deposited on an under film, wherein the etching is performed by converting a processing gas comprising an active species generating gas which includes a compound having carbon and fluorine, and a nonreactive gas which includes argon gas and xenon gas, into a plasma, wherein the ratio of the flow rate of the xenon gas to the total flow rate of the xenon gas and the argon gas is equal to or greater than 0.1 but not greater than 0.25.

5. The plasma etching method of claim 4, wherein the insulating film is a hydrogenated silicon oxycarbide film (SiCOH film).

6. The plasma etching method of claim 5, wherein the under film is a film selected from the group consisting of a silicon carbide film, a silicon nitride film, a silicon oxynitride film (SiON film) and a silicon oxycarbide film (SiCO film).

7. The plasma etching method of claim 4, wherein the active species generating gas is $C_4F_8$ gas or $CHF_3$ gas.

8. The plasma etching method of claim 5, wherein the active species generating gas is $C_4F_8$ gas or $CHF_3$ gas.

9. The plasma etching method of claim 6, wherein the active species generating gas is $C_4F_8$ gas or $CHF_3$ gas.

* * * * *